United States Patent [19]

Schucker et al.

[11] Patent Number: 4,948,991
[45] Date of Patent: Aug. 14, 1990

[54] LOAD CONTROLLED ECL TRANSIENT DRIVER

[75] Inventors: Douglas W. Schucker; David B. Weaver, both of Mesa; Pat Hickman, Chandler; Walter C. Seelbach, Fountain Hills, all of Ariz.

[73] Assignee: Motorola Inc., Schaumburg, Ill.

[21] Appl. No.: 266,613

[22] Filed: Nov. 3, 1988

[51] Int. Cl.[5] .................... H03K 19/086; H03K 3/33; H03K 17/60; H03K 3/01
[52] U.S. Cl. ............................. 307/455; 307/467; 307/254; 307/270; 307/280; 307/443; 307/300
[58] Field of Search ............... 307/455, 456, 466, 467, 307/254, 270, 443, 280, 300

[56] References Cited

U.S. PATENT DOCUMENTS

| | | | |
|---|---|---|---|
| 4,237,388 | 12/1980 | Nokubo et al. | 307/454 |
| 4,533,838 | 8/1985 | Fujita | 307/455 |
| 4,539,493 | 9/1985 | Varadarajan | 307/455 |
| 4,675,554 | 6/1987 | Koury, Jr. et al. | 307/455 |
| 4,687,953 | 8/1987 | Varadarajan | 307/270 |
| 4,698,525 | 10/1987 | Tavana et al. | 307/456 |

FOREIGN PATENT DOCUMENTS 0221219 9/1987 Japan ..................... 307/455

OTHER PUBLICATIONS

S. K. Wiedman, "TTL Circuit for Driving Heavy Load", IBM Technical Disclosure Bulletin, vol. 14, No. 5, Oct. 1971, p. 1436.

Primary Examiner—Stanley D. Miller
Assistant Examiner—Trong Quang Phan
Attorney, Agent, or Firm—Michael D. Bingham

[57] ABSTRACT

An ECL transient driver discharges a capacitive load at the output of an emitter follower with a pulse whose amplitude and duration is determined by the charge on the load. A pull-up transistor is coupled to an output terminal for selectively supplying a voltage thereto in response to a first signal from a logic circuit. A pull-down transistor is coupled to the output terminal for selectively sinking a current therefrom in response to a second signal. A comparator circuit is coupled to the pull-down transistor, the logic circuit, and the output terminal, for selectively providing the second signal in response to the first signal and an output voltage on the output terminal.

23 Claims, 5 Drawing Sheets

LOAD CONTROLLED ECL TRANSIENT DRIVER

FIELD OF THE INVENTION

This invention relates in general to emitter coupled logic (ECL) circuits and, more particularly, to a circuit that discharges the capacitive load at the output of an emitter follower with a pulse whose amplitude and duration is determined by the charge on the load.

BACKGROUND OF THE INVENTION

Historically, one of the most important advantages of bipolar transistor technology has been its ability to drive large resistive and capacitive loads with relatively small device geometries. For instance, a typical emitter coupled logic gate comprises an emitter coupled logic stage coupled to a transistor emitter-follower output stage which restores DC levels. The emitter-follower output stage sources output current at the output of the ECL gate that is an exponential function of the emitter-base voltage of the output transistor. High fanout operation is possible because of the high input impedance of the emitter coupled logic gate and the low output impedance of the emitter-follower output stage. Early conventional emitter-follower output stages typically included a resistor coupled as a "pull-down" device between the output of the ECL gate and the negative power supply rail which sets the quiescent current in the emitter-follower output stage. A problem occurs when such prior art ECL gates are operated into large capacitive loads which must be discharged as the output of the gate switches from a first logic level to a second logic level. In prior art ECL gates, the discharge current must flow through the resistor to the negative supply rail of the gate. Since the resistor is much larger in value than the "on" resistance of the emitter-follower transistor, discharge of the capacitor is much slower than the charge thereof since discharge is at a near constant rate determined by the resistor. Hence, the input logic signal applied to the subsequent gate is skewed. This is highly undesirable because of the added difficulty in designing the remaining circuitry due to the skewed edges.

To decrease the discharge time, the value of the resistor coupled to the emitter follower stage of the ECL gate can be made smaller. However, this results in a undesirable increase in quiescent power dissipation since the quiescent current flowing through the emitter-follower output stage is increased.

Another previously known driver circuit includes a "pull-down" PNP transistor having an emitter coupled to the output terminal, a collector coupled to the negative power supply rail, and a base coupled to a current path driven by the same signal driving the emitter follower. However, present technology is unable to provide a process for creating a PNP transistor of sufficient quality for competitive performance.

Yet another previously known driver circuit includes a "pull-down" NPN transistor having a collector connected to the output terminal, an emitter connected to the negative power supply rail, and a base coupled by a capacitor to an inverse signal to that driving the emitter follower. This circuit produces a high discharge current and a low standby current, however the discharge current is not proportional to the load capacitance.

Another previously known driver circuit is disclosed in U.S. Pat. No. 4,675,554 that is similar to the previously mentioned circuit.

Still another previously known driver circuit is disclosed in U.S. Pat. No. 4,687,953, wherein a dynamic ECL transient driver circuit is disclosed having a current enhancement portion for increasing the current to the base of the "pull-down" transistor. The current enhancement portion comprises differentially connected first and second transistors having their collectors coupled to the output terminal and their emitters coupled to the negative supply voltage rail by a current source. The base of the first transistor is connected to a current source voltage and the base of the second transistor is connected to its own collector and the base of the "pull-down" transistor by a resistor. Additionally, a capacitor is coupled between the base of the second transistor and the base of a transistor sourcing current to the output terminal. The discharge current of this circuit is not proportional to the load capacitance.

In order to utilize bipolar ECL gates in complex logic circuits, the static power requirement of the ECL gate needs to be reduced without sacrificing speed. Additionally, the bipolar ECL gates must be able to provide transient source and sink currents such that large capacitive loads can be driven at high speed while at the same time minimizing the quiescent power dissipation of the ECL gates.

Thus, what is needed is a ECL transient driver circuit that discharges capacitive load at the output of an emitter follower with a pulse whose amplitude and duration is determined by the charge on the load.

SUMMARY OF THE INVENTION

Accordingly, it is an object of the present invention to provide an improved ECL transient driver.

Another object of the present invention is to provide an ECL transient driver wherein the pull-down current is proportional to the load capacitance.

Still another object of the present invention is to provide an ECL transient driver having low standby DC current requirements.

Yet another object of the present invention is to provide an ECL transient driver having large load discharge currents only during output pulldown.

In carrying out the above and other objects of the invention in one form, there is provided a transient driver for driving a capacitive load comprising a logic circuit for providing a first signal. A pull-up transistor is coupled to the output terminal for selectively supplying a voltage thereto in response to the first signal. A pull-down transistor is coupled to the output terminal for selectively sinking a current therefrom in response to a second signal. A comparator circuit is coupled to the pull-down means, the logic circuit, and the output terminal, for selectively providing the second signal in response to the first signal and an output voltage on the output terminal, the second signal having a duration relative to the charge on the load.

The above and other objects, features, and advantages of the present invention will be better understood from the following detailed description taken in conjunction with the accompanying drawings.

DETAILED DESCRIPTION OF THE INVENTION

Figure 1:
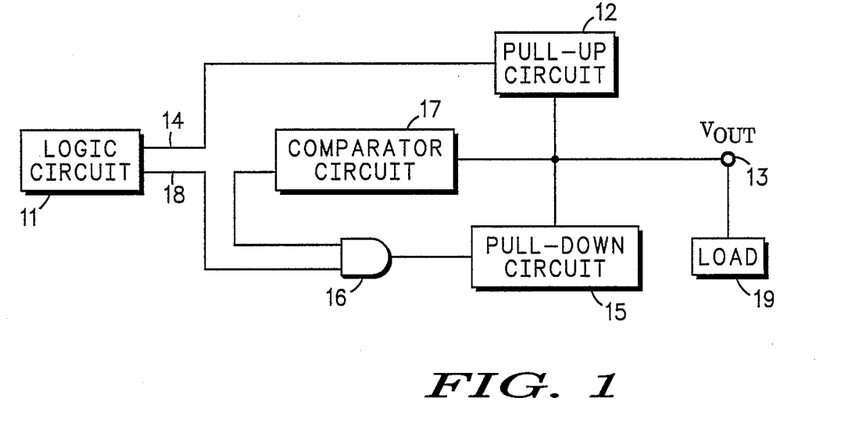
FIG. 1 is a block diagram of the preferred embodiment of the present invention.

Referring to FIG. 1, a block diagram of the driver circuit in accordance with the present invention comprises a logic circuit 11 that may comprise any type of logic such as a gate, a register, or a memory cell. The invention is shown in subsequent figures as emitter coupled logic, however may also be implemented in other logic families. A pull-up circuit 12 is connected to an output terminal 13 for supplying current thereto in response to a digital signal 14 from the driver circuit 11, and a pull-down circuit 15 is connected to the output terminal 13 for sinking current therefrom in response to a signal from an AND gate 16. A comparator circuit 17 is connected to the output terminal 13 for receiving an output voltage thereon and to the AND gate 16 for enabling the pull-down circuit 15. AND gate 16 is further connected to logic circuit 11 for enabling pull-down circuit 15 in response to the signals from logic circuit 11 and comparator circuit 17.

The signal 14 comprising a first digital state from the logic circuit 11 enables the pull-up circuit 12 for providing current to the output terminal 13 that charges a capacitive load 19 connected thereto. When the signal 14 from the logic circuit 11 changes to a second digital state, the pull-up circuit 12 will no longer supply current to the output terminal 13, and the pull-down circuit 15 will sink current therefrom. Signals 14 and 18 comprise inverse digital signals. When the signal 18 changes to the second state, and the output voltage on the output terminal 13 exceeds a reference voltage, the comparator circuit 17 enables the pull-down circuit 15. This enabling pulse has an amplitude and duration (time integral) that is determined by the charge on the load. The operation will be explained further with the more detailed embodiments described hereinafter.

Figure 2:
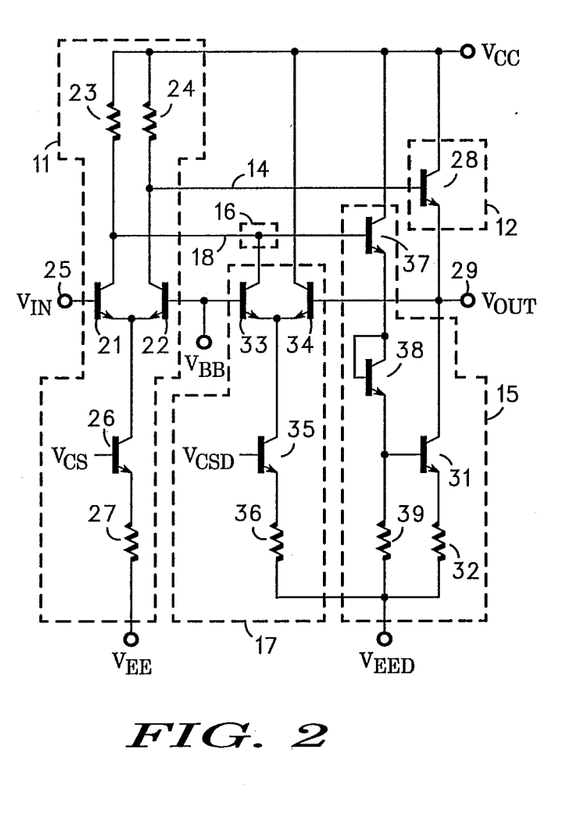
FIG. 2 is a schematical implementation of the preferred embodiment as a second embodiment.

Referring to FIG. 2, a detailed schematic of the block diagram of FIG. 1 in ECL technology comprises a pair of differentially connected transistors 21 and 22 having their collectors coupled to the supply voltage terminal $V_{CC}$ by resistors 23 and 24, respectively, their bases connected to an input terminal 25 and the voltage reference $V_{BB}$, respectively, and their emitters connected to the collector of a current source transistor 26. The transistor 26 has its base connected to the current source voltage $V_{CS}$ and its emitter coupled to the supply voltage terminal $V_{EE}$ by a resistor 27. An emitter follower transistor, or pull-up transistor, 28 has a collector connected to the supply voltage terminal $V_{CC}$, a base connected to the collector of the transistor 22, and an emitter connected to an output terminal 29. A pull-down transistor 31 has a collector connected to the output terminal 29 and an emitter coupled to the supply voltage terminal $V_{EED}$ by a resistor 32.

Differentially connected transistors 33 and 34 have collectors connected to the collector of the transistor 21 and the supply voltage terminal $V_{CC}$, respectively, bases connected to the voltage reference $V_{BB}$ and the output terminal 29, respectively, and emitters connected to the collector of a current source transistor 35. The transistor 35 has a base connected to the current source voltage $V_{CSD}$ and an emitter coupled to the supply voltage terminal $V_{EED}$ by a resistor 36. A transistor 37 has a collector connected to the supply voltage terminal $V_{CC}$ and a base coupled to the collector of the transistor 21. A diode connected transistor 38 has a collector and base connected to the emitter of transistor 37, and an emitter connected to the base of the transistor 31 and coupled to the supply voltage terminal $V_{EED}$ by a resistor 39.

In operation, assuming the output is initially in the high state, the transistor 34 will draw current from the current source transistor 35. When the input switches high to low, the differential pair transistors 21 and 22 switch states causing current to be routed from resistor 23 to resistor 24, causing the collector of transistor 21 to move up toward supply voltage $V_{CC}$. That rising collector voltage 18 for transistor 21 is transferred through the base-emitter junctions of transistors 37 and 38 to create a rising voltage on the base of the pull-down transistor 31. Transistor 31 will become more conductive, providing discharge current to pull the output voltage $V_{OUT}$ low. When the output voltage $V_{OUT}$ falls past $V_{BB}$, the differential transistors 33 and 34 switch states, with transistor 33 drawing the transistor 35 current. The transistor 33 current then pulls down through resistor 23 to create a falling voltage on the base of the transistor 37 which reduces the current flow through transistor 31 back to standby current level, completing the high to low transition. The low to high transition is accomplished in the conventional emitter follower fashion, with transistor 28 providing the charging current for the output voltage $V_{OUT}$ rising edge.

Figure 3:
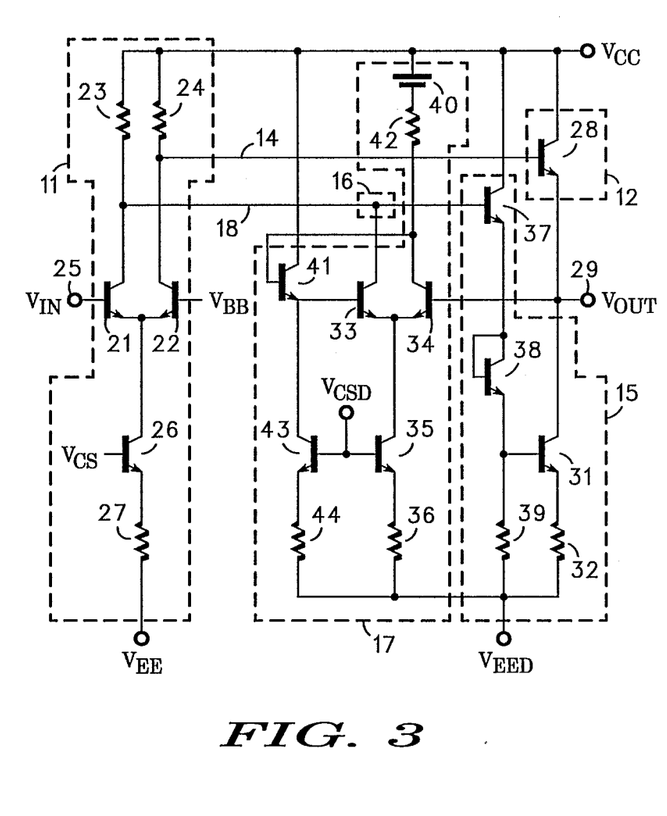
FIG. 3 is a schematical implementation of the preferred embodiment as a third embodiment.

Referring to FIG. 3, another embodiment teaches how to provide a bias voltage to the base of transistor 33. The components of FIG. 3 similar to those of FIG. 2 have been designated by the same reference numerals. A transistor 41 has a collector connected to the supply voltage terminal $V_{CC}$, a base connected to the collector of the transistor 34 and coupled to the supply voltage terminal $V_{CC}$ by a resistor 42, and an emitter connected to both the base of the transistor 33 and to the collector of a current source transistor 43. The transistor 43 has a base coupled to the current source voltage $V_{CSD}$ and an emitter coupled to the supply voltage terminal $V_{EED}$ by a resistor 44. This circuit embodiment provides a method to more closely control the switching characteristics of the differential transistors 33 and 34. The base voltage of transistor 33 is the voltage potential of supply voltage terminal $V_{CC}$ minus the sum of the base-emitter voltage of transistor 41 plus the voltage across resistor 42. The base voltage of transistor 33 can be tailored through the sizing of resistor 42 to control the shutoff timing of pull-down transistor 31, thus helping to control overshoots and undershoots of output voltage $V_{OUT}$. An offset voltage 40 can be applied to center the hysteresis.

Figure 4:
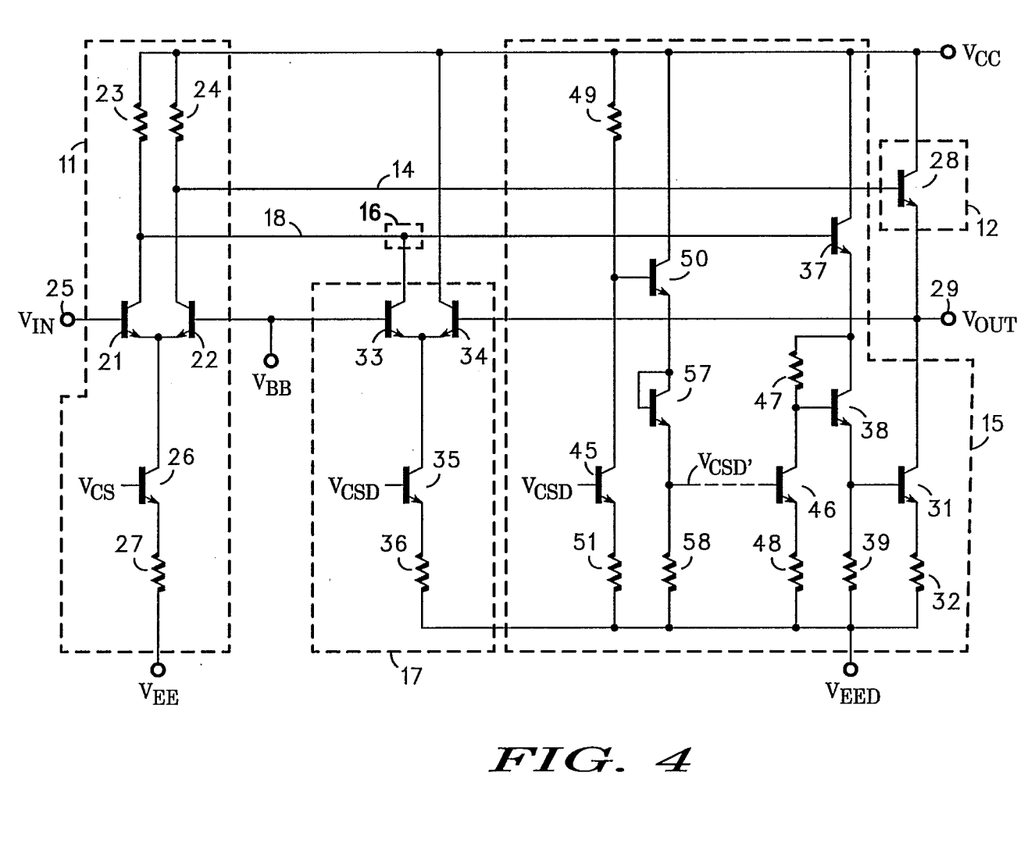
FIG. 4 is a schematical implementation of the preferred embodiment as a fourth embodiment.

Referring to FIG. 4, another embodiment teaches how to implement voltage supply compensation. The components of FIG. 4 similar to those of FIG. 2 have been designated by the same reference numerals. A transistor 45 has a collector coupled to the supply voltage terminal $V_{CC}$ by a resistor 49 and connected to the base of transistor 50, a base coupled to voltage $V_{CSD}$, and an emitter coupled to supply voltage terminal $V_{EED}$ by resistor 51. Transistor 50 has a collector connected to the supply voltage terminal $V_{CC}$ and an emitter connected to the collector and base of the diode connected transistor 57. The emitter of transistor is coupled to the supply voltage terminal $V_{EED}$ by resistor 58 and connected to the base of transistor 46. The transistor 46 has a collector connected to the base of the transistor 38 and coupled to the collector of the transistor 38 by a resistor 47, and an emitter coupled to the supply voltage terminal $V_{EED}$ by a resistor 48. This embodiment provides a method of compensation for $V_{EED}$ voltage supply variations. The current source comprising transistor 46 and resistor 48 sets up a voltage across resistor 47. A bias voltage $V_{CSD}'$ is applied to the base of transistor 46 to compensate for changes in $V_{EED}$ in such a way as to mirror, one to one, whereby a voltage change in $V_{EED}$ corresponds to an equivalent voltage change across resistor 47. The transistors 45, 50 and 57 and resistors 49, 51 and 58 provide the voltage $V_{CSD}$ to pull-down circuit 15. It should be understood that the voltage $V_{CSD}$ can also be coupled to other pull-down circuits similar to pull-down circuit 15. Proper voltage $V_{EED}$ regulation is attained if resistor pairs 23 and 49, and 36 and 51 are matched. This unity gain amplifier configuration results in a constant voltage difference from the base of transistor 38 to $V_{EED}$, thus keeping standby currents in resistor 39 and transistor 31 insensitive to $V_{EED}$ variations.

Figure 5:
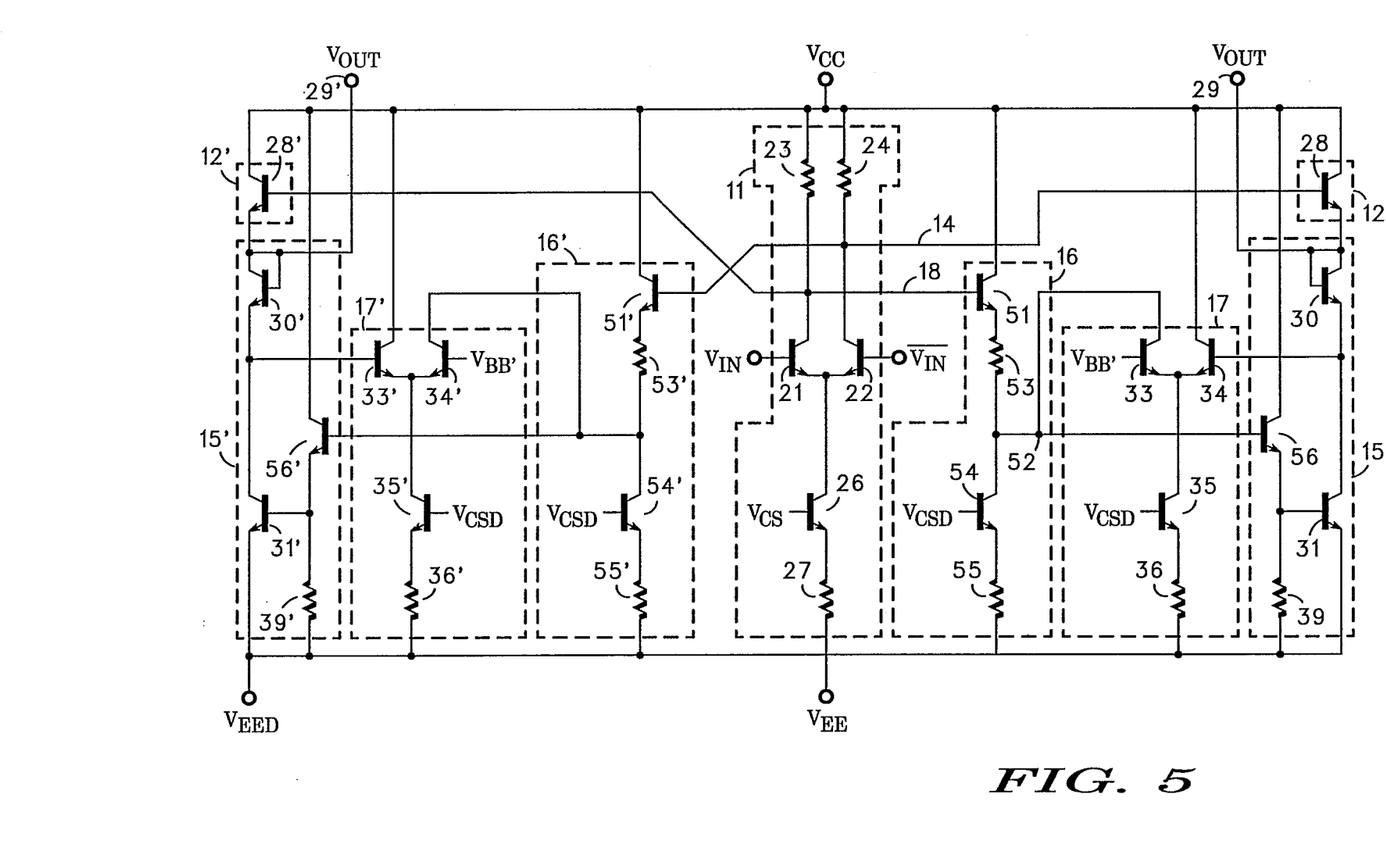
FIG. 5 is a schematical implementation of the preferred embodiment as a fifth embodiment.

Referring to FIG. 5, yet another embodiment teaches how to implement the invention in a dual differential mode. The components of FIG. 5 similar to those of FIG. 2 have been designated by the same reference numerals. Since the components on the left side of the figure are mirrored from the right side of the figure, like components are identified with a prime ('). Components for this embodiment include a transistor 51 having a collector connected to the supply voltage terminal $V_{CC}$, a base connected to the collector of the transistor 21, and an emitter coupled to a node 52 by a resistor 53. A current source transistor 54 has a collector connected to the node 52, a base connected to the current source voltage $V_{CSD}$, and an emitter coupled to the supply voltage terminal $V_{EED}$ by a resistor 55. The transistor 33 has its collector connected to the node 52. A transistor 56 has a collector connected to the supply voltage terminal $V_{CC}$, a base connected to the node 52, and an emitter connected to the base of the transistor 31 and coupled to the supply voltage terminal $V_{EED}$ by a resistor 57. This embodiment provides a way to operate differentially by recapturing correct logic levels on the complementary output side (the collectors of transistors 21 and 22). For the circuit of FIG. 2, when shutting off the pulldown transistor 31, transistor 33 pulls currents down through resistor 23, losing the logic high that would normally result from the switching of a differential pair, thus making the complement output unavailable. The embodiment of FIG. 5 solves that problem by adding a "stage" between the logic gate 11 and the pull-up circuit 12. Now instead of transistor 33 drawing current directly from resistor 23, it pulls current through the emitter follower stage of transistors 51 and resistor 53. Only base current of transistor 51 is pulled through resistor 23, maintaining it's correct logic level. The current source comprised of transistor 54 and resistor 55 sets up a bias in the emitter follower stage. To prevent saturation in the differential transistors 33 and 34, they are referenced down to $V_{BB}'$, the second level of ECL series gating. Transistors 51 and 56 provide the same level shifting function as did transistors 37 and 38 of FIG. 2. This explanation also applies to the complementary output side identified by the prime (') marks.

Figure 6:
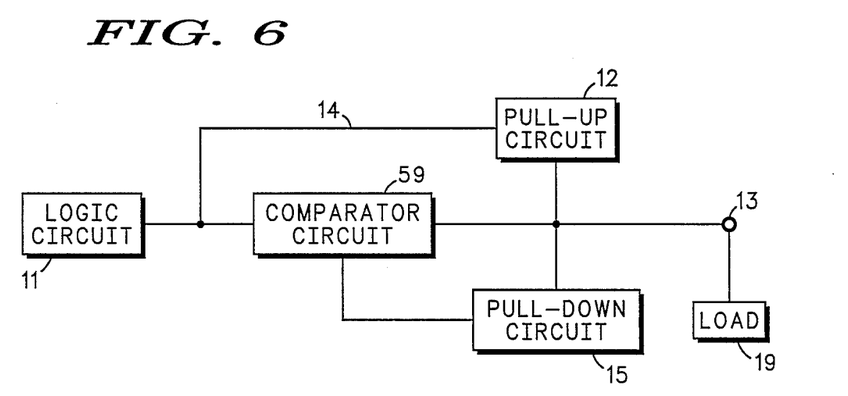
FIG. 6 is a block diagram of a sixth embodiment of the present invention.

Referring to FIG. 6, another embodiment of the invention in block diagram form teaches how to implement the active pull-down with only single ended output from logic circuit 11. The components of FIG. 6 similar to those of FIG. 1 have been designated by the same reference numerals. In accordance with this embodiment, a comparator circuit 59 is connected for enabling pull-down circuit 15 in response to an output signal on output terminal 13 and a digital signal 14 from logic circuit 11. The operation thereof will be better understood by referencing the discussion of the following schematical implementation.

Figure 7:
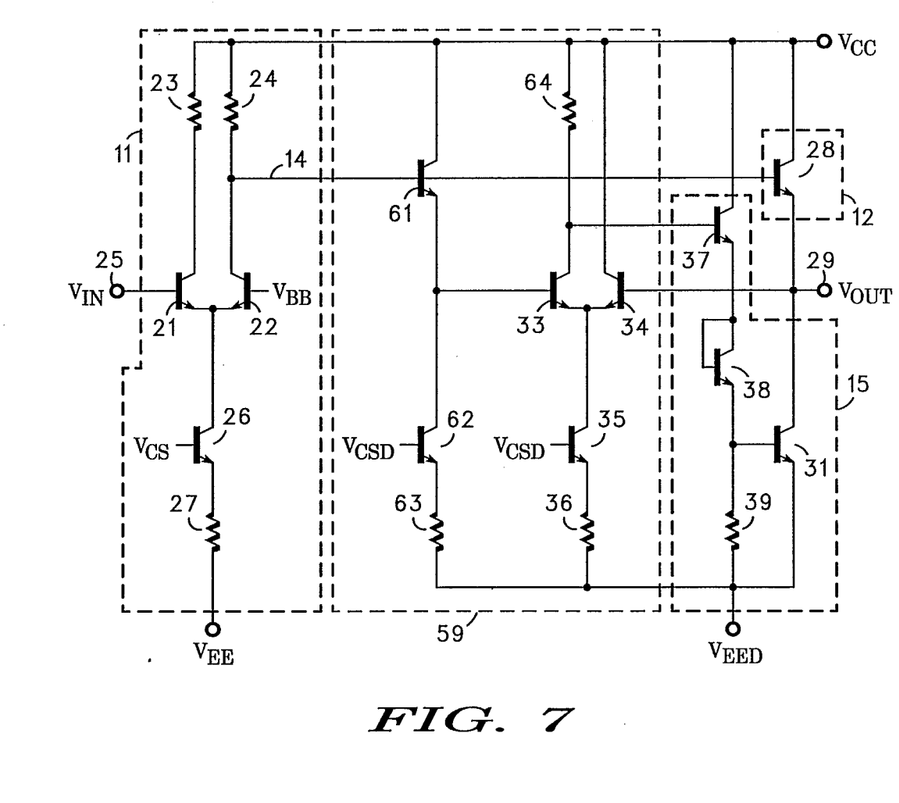
FIG. 7 is a schematical implementation of the sixth embodiment as a seventh embodiment.

Referring to FIG. 7, an embodiment of the circuit shown in FIG. 6 is shown schematically and includes a transistor 61 having a collector connected to the supply voltage terminal $V_{CC}$, a base connected to the collector of the transistor 22, and an emitter connected to both the base of transistor 33 and the collector of current source transistor 62. The transistor 62 has a base connected to current source voltage $V_{CSD}$ and an emitter coupled to supply voltage terminal $V_{EED}$ by resistor 63. The collector of the transistor 33 is coupled to the supply voltage terminal $V_{CC}$ by resistor 64 and is connected to the base of the transistor 37. This embodiment uses only the collector of transistor 22 as an input to the driver. The voltage on the collector of transistor 22 is provided to two emitter followers 61 and 28. Transistor 61, which is biased by the current source comprised of transistors 62 and resistor 63, is used to supply base current to transistor 33. The comparator 59, then, instead of comparing the output voltage to a reference voltage as in the previous embodiment, compares the loaded output voltage $V_{OUT}$ to the unloaded output voltage on the emitter of transistor 61. Thus, the pull-down pulse is not terminated until the end of the fall transition.

By now it should be appreciated that there has been provided a circuit that discharges the capacitive load at the output of an emitter follower with a pulse whose amplitude and duration is determined by the charge on the load.

We claim:

1. A circuit for driving a capacitive load, said circuit comprising:
    an output terminal coupled to the load;
    logic means for providing first and second signals;
    pull-up means coupled to said output terminal for selectively supplying a voltage thereto in response to said first signal;
    pull-down means coupled to said output terminal for selectively sinking a current therefrom in response to a third signal;
    comparator means responsive to a charge on the capacitive load and coupled to said output terminal for selectively providing a fourth signal having a time integral relative to said charge on the load; and
    gate means coupled to said pull-down means, said logic means and said comparator means for providing said third signal in response to said second and fourth signals.

2. The circuit according to claim 1 further including a first and second supply voltage terminals and wherein said comparator means comprises:
   a first current source;
   a first transistor having a collector coupled to said gate means for providing said fourth signal, a base coupled to receive a reference voltage, and an emitter coupled to said second supply voltage terminal by said first current source; and
   a second transistor having a collector coupled to said first supply voltage terminal, a base coupled to said output terminal, and an emitter coupled to said second supply voltage terminal by said first current source.

3. The circuit according to claim 2 wherein said pull-up means comprises a third transistor having a collector coupled to said first supply voltage terminal, a base coupled to said logic means for receiving said first signal, and an emitter coupled to said output terminal.

4. The circuit according to claim 3 wherein said pull-down means comprises a fourth transistor having a collector coupled to said output terminal, a base coupled to said gate means for receiving said third signal and an emitter coupled to said second supply voltage terminal.

5. The circuit according to claim 4, wherein said pull-down means further comprises:
   a first resistor; and
   a fifth transistor having a collector coupled to said first supply voltage terminal, a base coupled to said gate means for receiving said third signal, and an emitter coupled to the base of said fourth transistor and to said second supply voltage terminal by said first resistor.

6. The circuit according to claim 5 wherein said logic means comprises:
   an input terminal;
   a second resistor;
   a third resistor;
   a second current source;
   a sixth transistor having a collector coupled to said first supply voltage terminal by said second resistor and to said logic gate for providing said second signal, a base coupled to said input terminal, and an emitter coupled to said second supply voltage terminal by said current source; and
   a seventh transistor having a collector coupled to said first supply voltage terminal by said third resistor, a base coupled for receiving said reference voltage, and an emitter coupled to said second supply voltage terminal by said second current source.

7. The circuit according to claim 6 wherein said gate means is a wired-AND gate comprising a connection of the collectors of said first and sixth transistors and base of said fifth transistor.

8. The circuit according to claim 2 wherein said comparator means further comprises:
   a resistor;
   a second current source; and
   a third transistor having a collector coupled to said first supply voltage terminal, base coupled to said collector of said second transistor and to said first supply voltage terminal by said resistor, and an emitter coupled to said second supply voltage terminal by said second current source and to the base of said first transistor.

9. The circuit according to claim 4 wherein said comparator means further comprises:
   a resistor;
   a second current source; and
   a fifth transistor having a collector coupled to said first supply voltage terminal, a base coupled to said collector of said second transistor and to said first supply voltage terminal by said resistor, and an emitter coupled to said second supply voltage terminal by said second current source and to the base of said first transistor.

10. The circuit according to claim 5 wherein said pull-down means further comprises:
    a second resistor;
    a second current source; and
    a sixth transistor having a collector coupled to the emitter of said fifth transistor, a base coupled to its collector by said second resistor and to said second supply voltage terminal by said second current source, and an emitter coupled to the base of said fourth transistor.

11. The circuit according to claim 4 wherein said gate means comprises:
    a resistor;
    a second current source; and
    a fifth transistor having a collector coupled to said first supply voltage terminal, a base coupled to said logic means for receiving said second signal, and an emitter coupled to a node, said node coupled to said second supply voltage terminal by said second current source and to the collector of said first transistor.

12. A circuit for driving a capacitive load, said circuit comprising:
    an output terminal coupled to the load;
    logic means for providing a first signal;
    pull-up means coupled to said output terminal for selectively supplying a voltage thereto in response to said first signal;
    pull-down means coupled to said output terminal for selectively sinking a current therefrom in response to a second signal; and
    comparator means responsive to a charge on the capacitive load and coupled to said pull-down means, said logic means, and said output terminal, for selectively providing said second signal in response to said first signal and an output voltage on said output terminal, said second signal having a time integral relative to said charge on the capacitive load.

13. The circuit according to claim 12 wherein said comparator means comprises:
    a first resistor;
    a first current source;
    a second current source;
    a first transistor having a collector coupled to said first supply voltage terminal by said first resistor and coupled to said pull-down means for supplying said second signal, an emitter coupled to said second supply voltage terminal by said first current source, and a base;
    a second transistor having a collector coupled to said first supply voltage terminal, a base coupled to said output terminal, and an emitter coupled to said second supply voltage terminal by said first current source; and
    a third transistor having a collector coupled to said first supply voltage terminal, a base coupled to said logic means for receiving said first signal, and an emitter coupled to said second supply voltage terminal by said second current source and to the base of said first transistor.

14. The circuit according to claim 13 wherein said pull-down means comprises:
   a second resistor;
   a fourth transistor having a collector coupled to said output terminal, a base coupled to said second supply voltage terminal by said second resistor, and an emitter coupled to said second supply voltage terminal; and
   a fifth transistor having a collector coupled to said first supply voltage terminal, a base coupled to the collector of said first transistor, and an emitter coupled to the base of said fourth transistor.

15. The circuit according to claim 14 wherein said pull-up means comprises a sixth transistor having a collector coupled to said first supply voltage terminal, a base coupled to said logic means, and an emitter coupled to said output terminal.

16. The circuit according to claim 15 wherein said logic means comprises:
   an input terminal;
   a third resistor;
   a fourth resistor;
   a third current source;
   a seventh transistor having a collector coupled to said first supply voltage terminal by said third resistor, a base coupled to said input terminal, and an emitter coupled to said second supply voltage terminal by said third current source; and
   an eighth transistor having a collector coupled to said first supply voltage terminal by said fourth resistor and to said base of said third transistor, a base coupled for receiving said reference voltage, and an emitter coupled to said second supply voltage terminal by said third current source.

17. An improved ECL transient driver circuit including a logic means for providing a digital signal having first and second states in responsive to an input signal, a pull-up means coupled to said logic means for supplying current to a capacitive load during the first state, and a pull-down means for sinking current from the capacitive load during the second state, wherein the improvement comprises a comparator means coupled to said logic means, said load, and said pull-down means for enabling said pull-down means during the time period when the voltage on said load exceeds a predetermined relationship with the voltage of said digital signal during the second state.

18. The circuit according to claim 17 wherein said comparator means comprises:
   a first current source;
   a first transistor having a collector coupled to said logic means and said pull-down means, a base coupled to receive a reference voltage, and an emitter coupled to a second supply voltage terminal by said first current source; and
   a second transistor having a collector coupled to a first supply voltage terminal, a base coupled to said output terminal, and an emitter coupled to said second supply voltage terminal by said first current source.

19. The circuit according to claim 18 wherein the improvement further includes said pull-down means comprising:
   a first resistor;
   a third transistor having a collector coupled to said output terminal, a base coupled to said second supply voltage terminal by said first resistor, and an emitter coupled to said second supply voltage terminal; and
   a fourth transistor having a collector coupled to said first supply voltage terminal, a base coupled to said logic means and said comparator means, and an emitter coupled to the base of said third transistor.

20. The circuit according to claim 19 wherein said comparator further comprises:
   a second resistor;
   a second current source; and
   a fifth transistor having a collector coupled to said first supply voltage terminal, a base coupled to said collector of said second transistor and to said first supply voltage terminal by said second resistor, and an emitter coupled to said second supply voltage terminal by said current source and to the base of said first transistor.

21. The circuit according to claim 20 wherein said pull-down means further comprises:
   a third resistor;
   a third current source; and
   a sixth transistor having a collector coupled to the emitter of said fourth transistor, a base coupled to its collector by said third resistor and to said second supply voltage terminal by said third current source, and an emitter coupled to the base of said fourth transistor.

22. The circuit according to claim 17 wherein said comparator means comprises:
   a first resistor;
   a first current source;
   a second current source;
   a first transistor having a collector coupled both to a first supply voltage terminal through said first resistor and to said pull-down means, an emitter coupled to a second supply voltage terminal by said first current source, and a base;
   a second transistor having a collector coupled to said first supply voltage terminal, a base coupled to said output terminal, and an emitter coupled to said second supply voltage terminal by said first current source; and
   a third transistor having a collector coupled to said first supply voltage terminal, a base coupled to said logic means for receiving said digital signal, and an emitter coupled to said second supply voltage terminal by said second current source and to the base of said first transistor.

23. The circuit according to claim 22 wherein the improvement further includes said pull-down means comprising:
   a second resistor;
   a fourth transistor having a collector coupled to said output terminal, a base coupled to said second supply voltage terminal by said second resistor, and an emitter coupled to said second supply voltage terminal; and
   a fifth transistor having a collector coupled to said first supply voltage terminal, a base coupled to the collector of said first transistor, and an emitter coupled to the base of said fourth transistor.

* * * * *